US007327158B1

(12) United States Patent
Jun

(10) Patent No.: US 7,327,158 B1
(45) Date of Patent: Feb. 5, 2008

(54) ARRAY TESTING METHOD USING ELECTRIC BIAS STRESS FOR TFT ARRAY

(75) Inventor: Myungchul Jun, San Jose, CA (US)

(73) Assignee: Photon Dynamics, Inc., San Jose, CA (US)

( * ) Notice: Subject to any disclaimer, the term of this patent is extended or adjusted under 35 U.S.C. 154(b) by 0 days.

(21) Appl. No.: 11/461,381

(22) Filed: Jul. 31, 2006

(51) Int. Cl.
*G01R 31/00* (2006.01)
*G01R 31/26* (2006.01)

(52) U.S. Cl. .................................... 324/770; 324/765

(58) Field of Classification Search ................ 324/760, 324/769–770; 327/118
See application file for complete search history.

(56) References Cited

U.S. PATENT DOCUMENTS 5,504,438 A * 4/1996 Henley ...................... 324/770
5,982,190 A * 11/1999 Toro-Lira .................. 324/770
6,020,753 A * 2/2000 Maeda ...................... 324/769
2003/0137318 A1* 7/2003 Enachescu et al. ......... 324/770
2004/0032280 A1* 2/2004 Clark et al. ................ 324/770
2004/0246015 A1* 12/2004 Chung ...................... 324/764
2005/0068057 A1* 3/2005 Iwasaki et al. ............ 324/770
2005/0104615 A1* 5/2005 Kim .......................... 324/770

* cited by examiner

*Primary Examiner*—Ha Tran Nguyen
*Assistant Examiner*—Joshua Benitez
(74) *Attorney, Agent, or Firm*—Townsend and Townsend and Crew LLP

(57) ABSTRACT

A method of detecting thin film transistor (TFT) defects in a TFT-liquid crystal display (LCD) panel, includes, in part, applying a stress bias to the TFTs disposed on the panel; and detecting a change in electrical characteristics of the TFTs. The change in the electrical characteristics of the TFTs may be detected using a voltage imaging optical system or an electron beam. The panel temperature may be varied while the bias stress is being applied. The change in the electrical characteristics is optionally detected across an array of the TFTs.

10 Claims, 5 Drawing Sheets

ARRAY TESTING METHOD USING ELECTRIC BIAS STRESS FOR TFT ARRAY

BACKGROUND OF THE INVENTION

The present invention relates to testing of thin film transistor (TFT) arrays, and more particularly to testing the functionality and reliability of such arrays.

Thin film transistor liquid crystal displays (TFT-LCD) for, e.g., television applications require brighter backlight for better image quality. FIG. 1 is a cross-sectional view of a TFT-LCD module assembly. The stack includes a polarizer layer 14 and optical film 12, followed by the TFT panel 10 above which liquid crystal layer 16 is formed, and then the backlight 20. Color filter 22 and polarizer 14 are disposed above liquid crystal layer 16. Brighter backlight increases the temperature of TFT-LCD during operation, thus resulting in an increase in the TFT-LCD off current $I_{off}$. For good TFTs, the variation in $I_{off}$ as a function of temperature is relatively small, and does not affect the TFT-LCD image quality. However, In the case of defective TFTs, the off-current variation with temperature is large enough to deteriorate the TFT-LCD image quality during operation.

FIG. 2 is a cross-sectional view of a typical amorphous silicon (a-Si) TFT, which are typically N-channel enhancement type field effect transistors. Metal gate 40 is patterned first on a glass plate, followed by plasma enhanced CVD (chemical vapor deposition) deposition of a gate insulator dielectric material 42, such as silicon nitride (SiN), and layers of amorphous silicon semiconductor (a-Si) 44 and n+ a-Si 46. Source metal layer 48 and drain metal layer 50 are then patterned. Next, a passivation layer 52 is deposited over the whole structure. The n+ a-Si layer 46 acts as a low resistance ohmic contact for electrons to maximize the ON current. It also blocks injection of holes into the intrinsic layer to minimize the leakage current in the OFF state.

TFTs in flat panel displays operate as switches. If the gate voltage exceeds the threshold voltage, and a voltage is applied across the source and drain terminals, current flows from the source to drain. Gate layer 40 and a-Si layer 44 act as parallel plates of a capacitor between which dielectric SiN layer 42 is disposed.

Amorphous silicon is not very stable and its properties can be modified when exposed to strong illumination or injection of charge carriers. Over time, the interface between the a-Si layer 44 and SiN dielectric layer 42 can accumulate charge during normal operation of the TFT, thereby causing a shift over time of the threshold of the a-Si TFT. Under normal operating conditions, the threshold voltage shift during the ON-times is of the opposite polarity to that occurring during the OFF-times. Therefore, the shifts partially cancel one another. Furthermore, as long as the TFT drive can overcome this shift or variation, operation is not compromised.

FIG. 4A is an energy band diagram for an ideal amorphous semiconductor. For amorphous semiconductors, intrinsic localized states separated by the gap between the conduction band and valence band are established near the band edges. However, impurities, such as defects or dangling bonds within the amorphous material, populate the band gap with localized defect states, as shown in FIG. 4B. The localized defect states result in mobility of charges at nonzero temperatures due to thermally assisted tunneling between localized states. Thus, unlike normal semiconductors, the activation energy in amorphous semiconductors such as a-Si is related to the mobility gap rather than an energy gap.

The source-to-drain current $I_{SD}$ of a TFT is related to the density of states by the following expression:

$$\ln I_{SD} \propto \left[A - \frac{E_C - E_F - q\Psi_S}{kT}\right]$$

where A is a constant, $E_C$ is the conduction energy, $E_F$ is Fermi energy, $\Psi_S$ is density of states, q is charge of electron, k is Boltzmann's constant, and T is temperature in Kelvin. FIG. 5 is an energy band diagram of the metal-insulator-semiconductor (MIS) structure, shown in FIG. 3.

With no voltages applied and at room temperature, the source-to-drain current $I_{SD}$ ($I_{OFF}$) of the TFT has a small but nonzero value. As temperature increases, $I_{SD}$ rises, as illustrated in FIG. 6. In some TFT-LCD panel applications, such as televisions, in which the TFTs are illuminated and therefore heated by backlights, current $I_{off}$ normally remains sufficiently low.

During the processing of a TFT, a-Si is deposited through plasma enhanced chemical vapor deposition (PECVD) of silane or similar materials and methods. The resulting a-Si film is left with dangling bonds when the silicon-to-silicon bonds are broken. The dangling bonds are defects within the amorphous semiconductor layer and contribute to a nonzero density of states within the band gap, thereby resulting in the mobility of charges (off current). To minimize the density of states due to dangling bonds, the a-Si is hydrogenated. Typically for TFTs, a-Si:H film contains approximately 10 to 20% hydrogen.

During processing, however, the Si:H bond can be inadvertently broken. For example, during ion bombardment of the a-Si:H film, high energy ions can break the Si:H bond, leaving dangling bonds that lead to an increase in the density of states, and higher $I_{off}$. Generation of high energy ions during processing can be due to poor or incorrect process parameters, and may result in a global plate (panel) effect rather than in a single, stand-alone TFT defect. In other words, a whole area of a panel rather than a single isolated TFT may have poor quality a-Si:H film.

A good TFT has a lower density of states in the band gap of a-Si:H and SiNx film, whereas a defective TFT has a higher density of states in the band gap of a-Si:H and SiNx film. As the temperature increases, the charges which are trapped in the band gap transport to the conduction band and contribute to TFT off current. Therefore, a defective TFT will have a larger $I_{off}$ at higher temperature (See FIG. 6).

Before the introduction of high illumination backlights for TFT-LCD televisions, the defects described above did not result in failed pixels, and the threshold voltage shifts due to turning the TFTs on and off canceled one another. Recently, the TFT-LCD panel manufacturers have noticed at module assembly that the powerful (and therefore heating) backlights cause such defects and adversely affect the yield. This type of defect cannot be repaired, but detecting it sufficiently early in the fabrication process is important to enable feedback and correction to the fabrication operational parameters to minimize loss.

One known method of detecting these defects takes advantage of the dependency of doff on temperature. Off current is measured while heat is applied to a TFT-LCD plate or panel that has been assembled into a module. In practice, however, such a method is difficult to implement at the high throughput rates required by the TFT-LCD manufacturers. Sampling is an acceptable technique, and currently manufacturers test fully assembled modules after the array is fabricated and after many of the assembly steps are completed. The main drawbacks associated with heating full panels and measuring $I_{off}$ are (a) the time required to heat the panels and (b) the complexity of the apparatus needed to accommodate the large-sized panels, which may be two meters long, and two meters wide.

A need continues to exist for a method and apparatus that detects this type of TFT defect during array testing of LCD plates and well before the process steps in which plates are divided into panels and assembled into modules.

BRIEF SUMMARY OF THE INVENTION

A method of detecting thin film transistor (TFT) defects in a TFT-liquid crystal display (LCD) panel, includes, in part, applying a stress bias to the TFTs disposed on the panel; and detecting a change in electrical characteristics of the TFTs. The change in the electrical characteristics of the TFTs may be detected using a voltage imaging optical system or an electron beam.

In some embodiments, the panel temperature is varied while the bias stress is being applied. The panel may be heated or cooled while the bias stress is being applied. In some embodiments, the change in the electrical characteristics is detected across an array of the TFTs.

The defect detection may be applied at the TFT fabrication level to screen defective plates prior to assembly into modules. The defect detection is performed at an early stage in the process and thus reduces the overall costs.

DETAILED DESCRIPTION OF THE INVENTION

In accordance with the present invention, to detect defects in a TFT panel, an electric bias is applied to the TFT panel for a known time period. The applied electric bias induces charge trapping in the SiNx film and/or state creation in the a-Si:H film, thus giving rise to the TFT threshold voltage shift. The shift in the threshold voltage results in the variation of the TFT $I_{OFF}$ current. The amount of the threshold voltage shift ($\Delta V_T$) depends on the applied bias voltage, the duration of the bias, as well as the initial density of state in the films.

Figure 1:
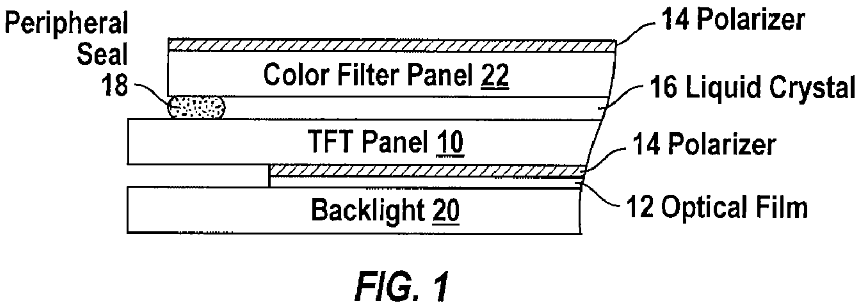
FIG. 1 is a cross sectional view of a flat panel display (FPD) assembly, as known in the prior art.
Figure 2:
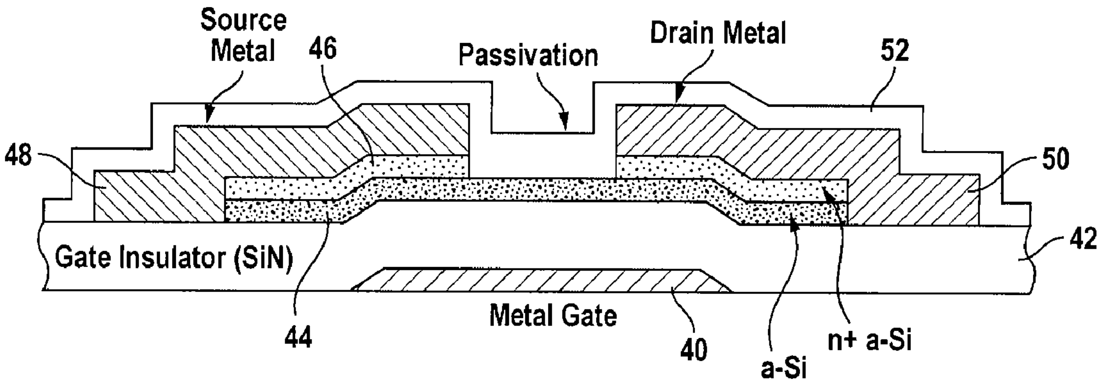
FIG. 2 is a cross sectional view of an amorphous silicon (a-Si) thin film transistor (TFT), as known in the prior art.
Figure 3:
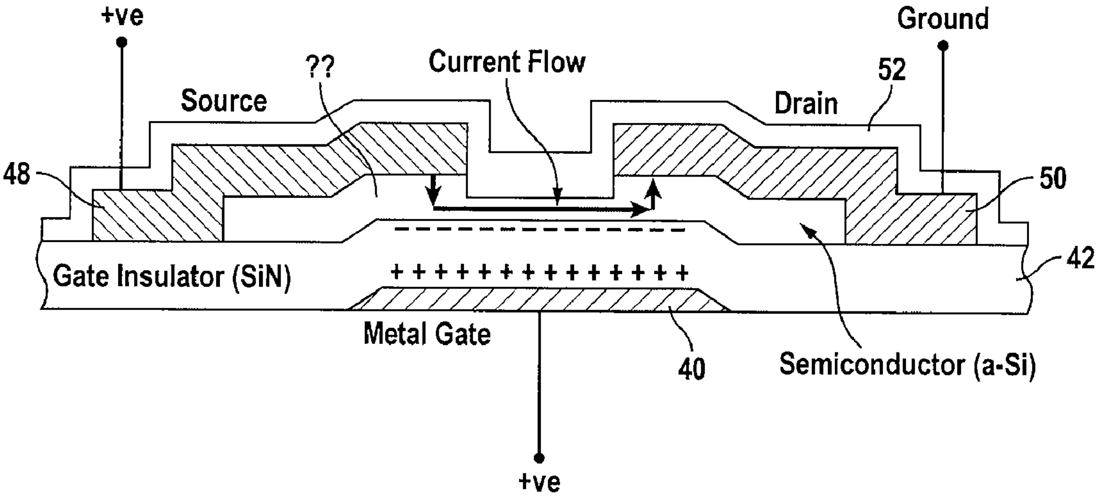
FIG. 3 shows the formation of the conductive channel and current flow in the TFT of FIG. 2, as known in the prior art.
Figure 4A:
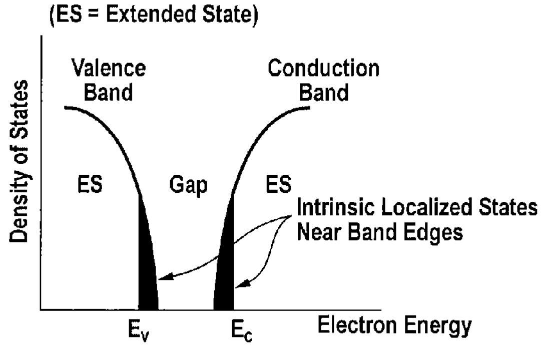
FIG. 4A is an energy band diagram of an ideal amorphous semiconductor, as known in the prior art.
Figure 4B:
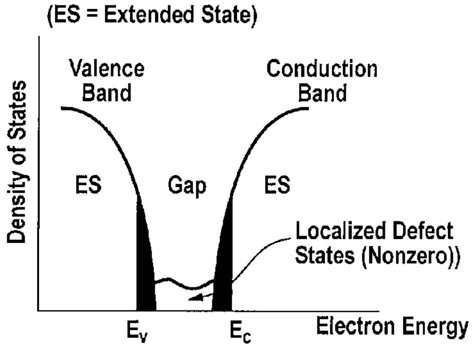
FIG. 4B is an energy band diagram of a typical amorphous semiconductor, as known in the prior art.
Figure 5:
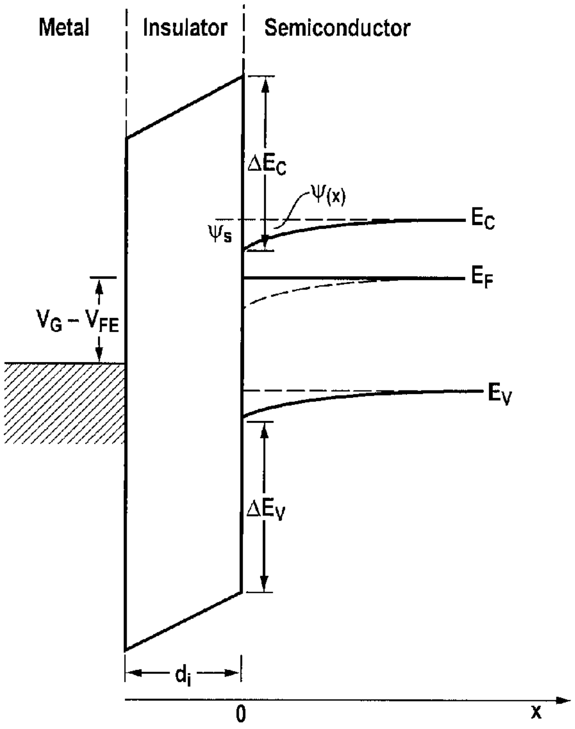
FIG. 5 is an energy band diagram of an MIS (metal-insulator-semiconductor), as known in the prior art.
Figure 6:
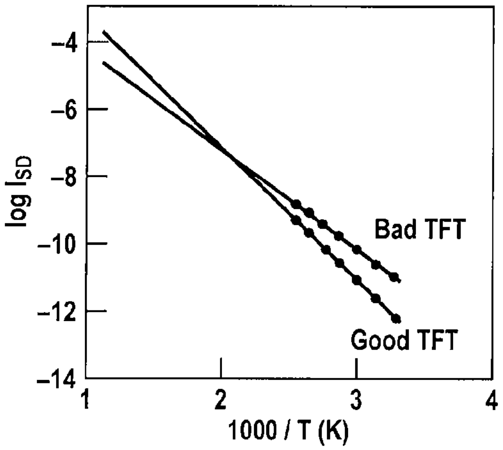
FIG. 6 shows a number of plots of drain-to-source currents of TFTs as a function of inverse temperature, as known in the prior art.
Figure 7A:
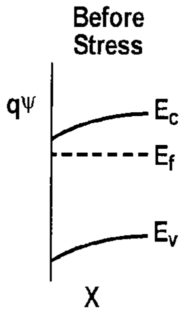
FIG. 7A is an energy band diagram of an MIS device prior to the application of an electric bias.
Figure 7B:
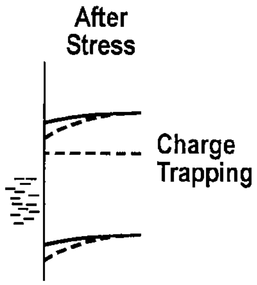
FIG. 7B is an energy band diagram of the MIS device of FIG. 7A after the application of an electric bias causing charges to be trapped in the band gap.
Figure 7C:
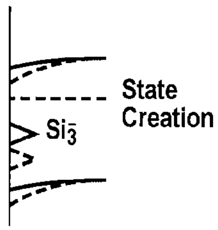
FIG. 7C is an energy band diagram of the MIS device of FIG. 7A after the application of an electric bias causing states to be created in the band gap

FIG. 7A is an energy band diagram of an MIS device prior to the application of an electric bias. FIG. 7B is an energy band diagram of the MIS device of FIG. 7A after the application of an electric bias causing charges to be trapped in the band gap. FIG. 7C is an energy band diagram of the MIS device of FIG. 7A after the application of an electric bias causing states to be created in the band gap.

Figure 8:
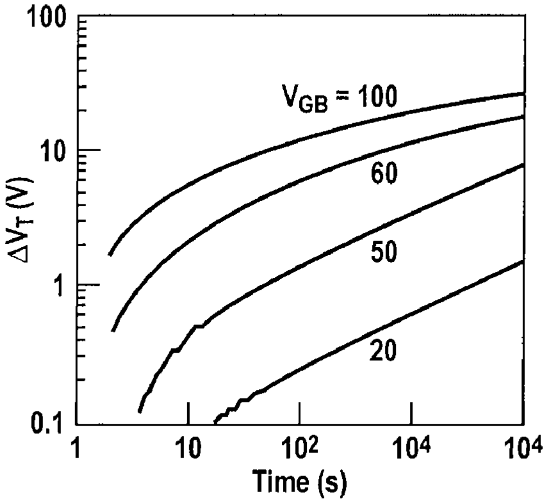
FIG. 8 shows the dependence of TFT threshold voltage shift on bias stress time and bias stress voltage.

FIG. 8 shows the dependence of TFT threshold voltage shift on the bias stress time and bias stress voltage. As seen from FIG. 8, the longer the stress time or the greater the bias voltage $V_{GB}$, the greater is the amount of the threshold voltage shift $\Delta V_T$.

Figure 9:
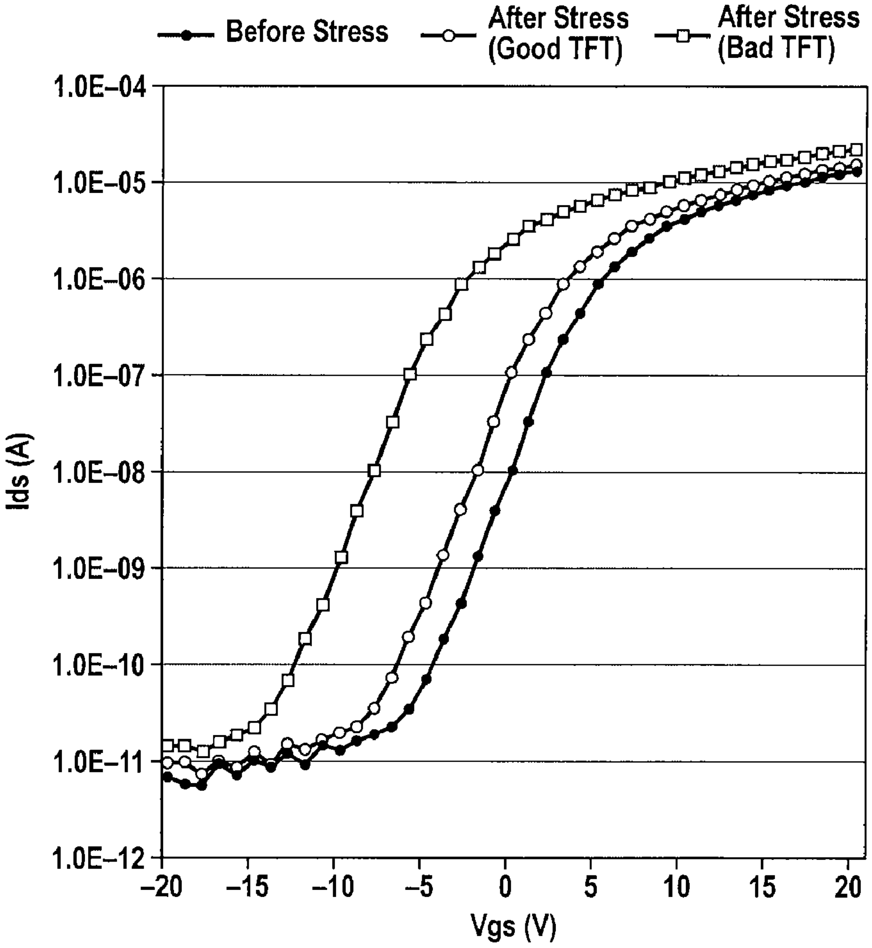
FIG. 9 show various plots of the drain-to-source current as a function of gate-to-source voltage for a good and a defective TFT before and after application of a bias stress.

Plot 100 of FIG. 9 shows the drain-to-source current as a function of gate-to-source voltage for both a good and a defective TFT before application of a bias stress. Plot 102 of FIG. 9 shows the drain-to-source current as a function of gate-to-source voltage for a good TFT after application of a bias stress. Plot 104 of FIG. 9 shows the drain-to-source current as a function of gate-to-source voltage for a defective TFT after the application of a bias stress. As seen from FIG. 9, for each gate-to-source voltage, the shift in current—caused by the shift in the threshold voltage—is greater for a defective TFT than a good TFT.

Thus, in accordance with the present invention, to detect defects related to the a-Si:H layer in TFTs, an electric bias stress is applied for a time sufficient to increase the defect's density of states. The increase in the defect's density of states causes a corresponding shift in the threshold voltage and the $I_{off}$ of the device. The stressed plate or panel with shifted threshold voltage can then be electrically tested using standard TFT array testers, such as the Array Checker manufactured by Photon Dynamics, Inc., located at 5970 Optical Court, San Jose, Calif. 95138, which uses a voltage imaging optical system (VIOS) technology. Other electrical array testers, such as those using electron beam technology or any other means to measure threshold voltage shift, may also be used.

Figure 10:
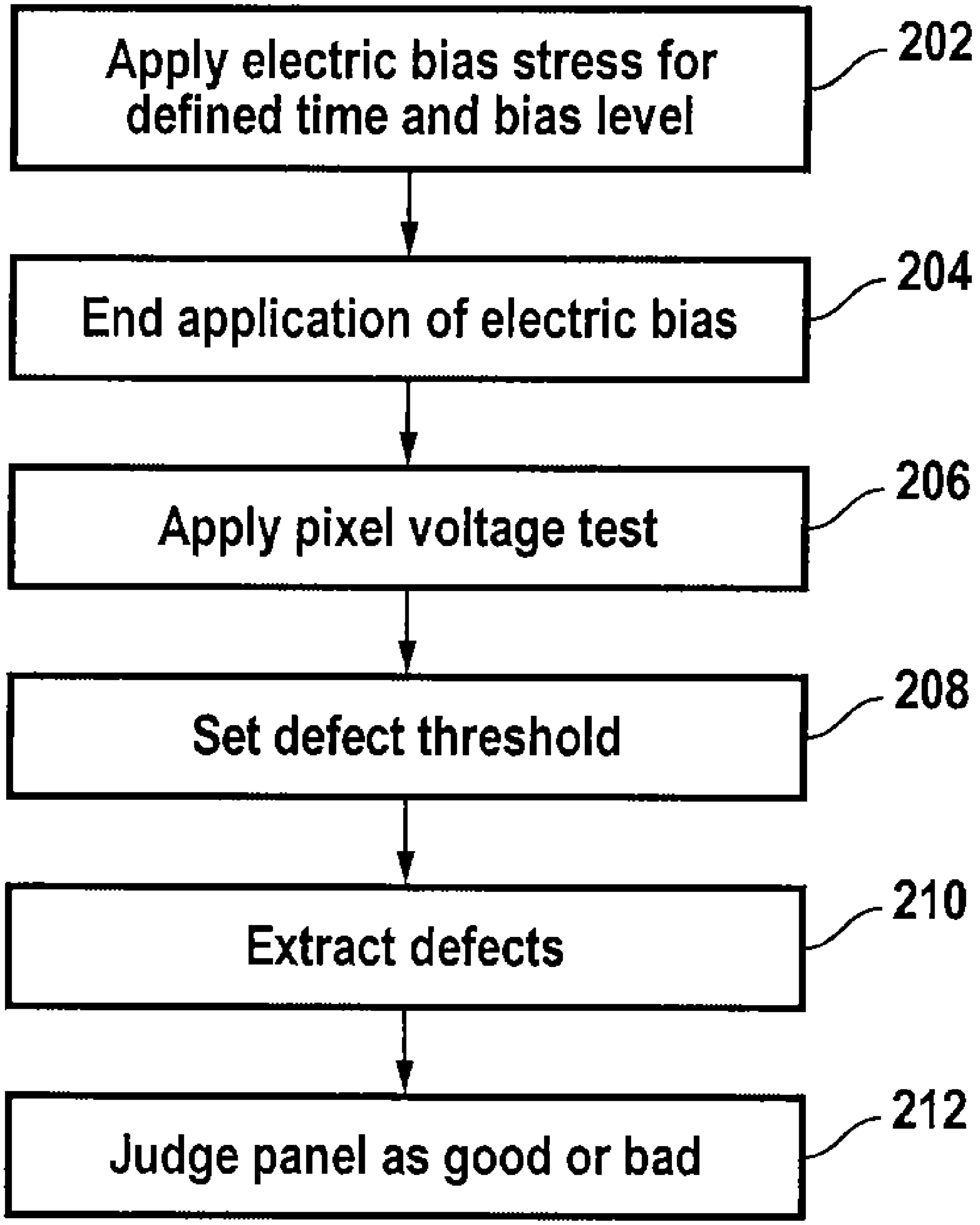
FIG. 10 is a flowchart of steps taken to detect defects related to the a-Si:H layer in TFTs, in accordance with one embodiment of the present invention.

FIG. 10 is a flowchart of steps taken to detect defects related to the a-Si:H layer in TFTs in accordance with one embodiment of the present invention. Electric (voltage) bias stress is applied to the panel under test 202. The voltage level and the duration of the bias is selected by the user. The application of the electric bias test ends at 204. The bias stress causes defective panels to have shifted threshold voltage shift. Next, a pixel electric test using a tester, such as the Array Checker, manufactured by Photon Dynamics, Inc., is performed to measure voltage changes. The defect threshold is set either prior or after the application of the stress test 208. The bias stress causes defective panels to have shifted threshold voltage shift which is detectable by the VIOS. Following the defect extraction 210, the worthiness of panel based on degree of defectiveness is determined 212.

In some embodiments, the user adjustable stress voltage may be +/−50 volts, and the user adjustable stress time may vary between 1000 to 2000 seconds. The stress may be applied on a sample of panels in the fabrication flow or on every panel.

In some embodiments, the bias stress time may be reduced if accompanied by a temperature change in the panel. As such, the plate under test may be warmed or cooled simultaneously with the application of the voltage stress.

Alternatively, the plate under test may be warmed or cooled either before or after the application of the voltage stress.

As long as the temperature of the a-Si:H film remains below the a-Si:H deposition temperature of approximately, e.g., 250 to 350° C., the TFTs (both good and defective) are not further damaged. Elevating the TFT temperature to, for example, 50° C. in combination with the stress test may be sufficient to reveal the defects.

TFTs stressed by the application of the heat relax back to their normal (good or defective) condition after the heat source is removed. Thus, heating may be required as the voltage testing is in progress. This arrangement may have a drawback if the voltage testing method has a dependency on temperature.

TFTs stressed by the application of a bias voltage relax back to their normal (good or defective) condition after the bias voltage is removed. Typical relaxation time may be several hours, and usually less than a day. Thus, a bias voltage may be applied to a plate at a different location from the array tester machine. The plate may subsequently be placed into the array tester for testing within a short period of time (less than a few hours). This may be helpful to keep the utilization of the array tester high.

The above embodiments of the present invention are illustrative and not limiting. Various alternatives and equivalents are possible. Other additions, subtractions or modifications are obvious in view of the present disclosure and are intended to fall within the scope of the appended claims.

What is claimed is:

1. A method for detecting thin film transistor (TFT) defects in a TFT-liquid crystal display (LCD) panel, the method comprising:

applying a stress bias to the TFTs disposed on the panel to cause a change in a threshold voltage or off current of one or more of the TFTs;

terminating the stress bias;

applying test signals to the TFTs; and detecting the change in the threshold voltage or off current of the one or more of the TFTs in response to the applied test signals.

2. The method of claim 1 wherein the change in the threshold voltage or off current of the one or more of the TFTs is detected using a voltage imaging optical system.

3. The method of claim 1 wherein the change in the threshold voltage or off current of the one or more of the TFTs is detected using an electron beam.

4. The method of claim 1 further comprising:

changing a temperature of the panel while applying the stress bias.

5. The method of claim 4 further comprising:

heating the panel while applying the stress bias.

6. The method of claim 4 further comprising:

cooling the panel while applying the stress bias.

7. The method of claim 1 further comprising:

changing a temperature of the panel while detecting a change in the threshold voltage or off current of the one or more of the TFTs.

8. The method of claim 7 further comprising:

heating the panel while detecting a change in the threshold voltage or off current of the one or more of the TFTs.

9. The method of claim 7 further comprising:

cooling the panel while detecting a change in the threshold voltage or off current of the one or more of the TFTs.

10. The method of claim 1 wherein said TFTs are disposed in an array, the method further comprising:

detecting a changes in the threshold voltage or off current of the one or more of the array of TFTs.

* * * * *